| United States Patent [19] | [11] | 4,063,948 |
|---|---|---|
| Lind | [45] | Dec. 20, 1977 |

[54] MATERIAL FOR ELECTROPHOTOGRAPHIC REPRODUCTION

[75] Inventor: Erwin Lind, Auringen, Germany

[73] Assignee: Hoechst Aktiengesellschaft, Germany

[21] Appl. No.: 694,712

[22] Filed: June 10, 1976

[30] Foreign Application Priority Data

June 14, 1975 Germany .............................. 2526720

[51] Int. Cl.² ................................................ G03G 5/06
[52] U.S. Cl. ....................................... 96/1.6; 96/1.5 R
[58] Field of Search .................... 96/1.5, 1.6, 1.7, 129, 96/130, 1 PC

[56] References Cited

U.S. PATENT DOCUMENTS

| 2,639,282 | 5/1953 | Sprague et al. ................... 96/130 X |
| 2,974,141 | 3/1961 | Plue .................................... 96/129 X |
| 3,220,832 | 11/1965 | Uhlig .................................... 96/1.5 |
| 3,287,114 | 11/1966 | Hoegg ................................... 96/1.5 |
| 3,660,086 | 5/1972 | Tamai et al. ........................... 96/1.7 |
| 3,666,464 | 5/1972 | Keller et al. ........................ 96/1.6 X |
| 3,874,943 | 4/1975 | Watarai et al. ......................... 96/1.6 |
| 3,923,507 | 12/1975 | Ohlschlager et al. .................. 96/1.6 |

FOREIGN PATENT DOCUMENTS

| 2,156,886 | 5/1972 | Germany .............................. 96/1.6 |

OTHER PUBLICATIONS

Takasu et al., "Spectral Sensitization of Poly(N-Vinyl Carbazole) by Cyanine and Styryl Dyes", Jour. Chem. Soc. Japan, Chem. and Ind. Chem., Jan. 1973, vol. 1, pp. 29-34.

*Primary Examiner*—Roland E. Martin, Jr.
*Attorney, Agent, or Firm*—James E. Bryan

[57] ABSTRACT

This invention relates to a material for electrophotographic reproduction, which comprises a conductive support having a sensitized photoconductive insulating layer thereon containing at least one photoconductor and containing, as a sensitizer, a polymethine dyestuff capable of absorbing radiation of a wavelength within the spectral range of 400 to 550 nm.

22 Claims, No Drawings

MATERIAL FOR ELECTROPHOTOGRAPHIC REPRODUCTION

The present invention relates to a material for electrophotographic reproduction, composed of a conductive support and a sensitized photoconductive insulating layer adhering thereto.

It already has been proposed, in German Pat. No. 1,058,836, to use photoconductors for electrophotographic reproduction having a spectral sensitivity which is generally in the long wave ultra-violet region of about 350 to 450 nm.

In order to extend the spectral sensitivity range to about 650 nm, it has been proposed to use various dyestuffs of different chemical types as sensitizers. Dyestuffs which are effective are, for example, the following, which are listed in the Schultz Dyestuff Tables (7th Edition, Volume 1,1931); triarylmethane dyestuffs, such as Brilliant Green (No. 760, p. 314), Victoria Blue B (No. 822, p. 347), Methyl Violet (No. 783, p. 327), Crystal Violet (No. 785, p. 329), Acid Violet 6B (No. 831, p. 351); xanthene dyestuffs, i.e. rhodamines, such as Rhodamine B (No. 864, p. 365), Rhodamine 6G (No. 866, p. 366), Rhodamine G extra (No. 865, p. 366), Sulforhodamine B (No. 863, p. 364) and Fast Acid Eosin G (No. 870, p. 368), also phthaleins, such as Eosin S (No. 883, p. 375), Eosin A (No. 881, p. 374), Erythrosin (No. 886, p. 376), Phloxin (No. 890, p. 378), Bengal Rose (No. 889, p. 378), and Fluorescein (No. 880, p. 373); thiazine dyestuffs, such as methylene blue (No. 1038, p. 449); acridine dyestuffs, such as Acridine Yellow (No. 901, p. 383), Acridine Orange (No. 908, p. 387) and Trypaflavin (No. 906, p. 386); Quinoline dyestuffs, such as Pinacyanole (No. 924, p. 396) and Cryptocyanine (No. 927, p. 397); Quinone dyestuffs and ketone dyestuffs such as Alizarin (No. 1141, p. 499), Alizarin red S (No. 1145, p. 502) and Quinizarin (No. 1148, p. 504); and cyanine dyestuffs.

The sensitization of the photoconductors is based in principle on the fact that the light energy available in the long wavelength range is absorbed by the sensitizers and transferred to the photoconductor molecule.

The object of the invention, by contrast, was to undertake sensitization in the short wavelength absorption range of the photoconductor, i.e. in the blue range of the spectrum. Such sensitization hitherto has been regarded as undesirable, because it would prevent the reproduction of blue portions, e.g. of ink or ball-point pen paste, of an original.

The present invention provides a material for electrophotographic reproduction, which comprises a conductive support having a sensitized photoconductive insulating layer thereon containing at least one photoconductor and containing as a sensitizer a polymethine dyestuff capable of absorbing radiation of a wavelength within the spectral range of from 400 to 550 nm, preferably 480 to 520 nm.

A particularly suitable sensitizer is a polymethine dyestuff capable of absorbing radiation of a wavelength within the specified spectral range and having the general formula I

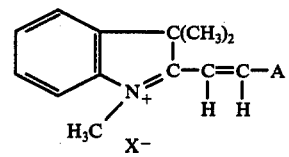

wherein A is an unsubstituted or substituted indolyl group, an unsubstituted or substituted benzthiazolylamino group, an unsubstituted or substituted phenylamino group or an unsubstituted or substituted indolyinyl group, and X⁻ is a monovalent anion, preferably a halide ion, more preferably a chloride ion.

The sensitizer is preferably either C. I. Basic Orange 21 (C.I. 48035 — Astrazone Orange G) of the formula II

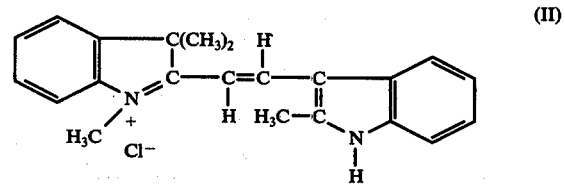

or C. I. Basic Orange 22 (C. I. 48040 — Astrazone Orange R) of the formula III

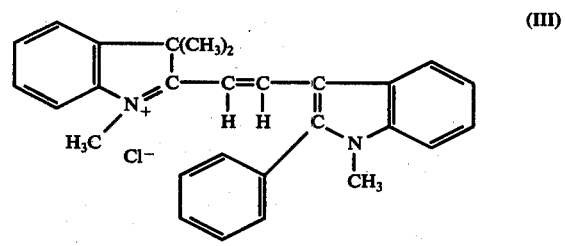

As a result of the presence of the sensitizer, the photoconductive layer becomes sensitive to blue light, which is necessary in particular with regard to the use of argon ion lasers in reproduction technology, which has recently achieved great importance. Furthermore, in special fields of reproduction technology, mounting sheets are used with blue lines which are not reproduced during reproduction on lithographic silver film. Insofar as the silver film materials are to be replaced by electrophotographic materials, it is necessary to sensitize the latter to blue light.

Surprisingly, it is possible according to the invention to sensitize organic photoconductors in a range close to their own natural absorption ranges so that a sensitivity is obtained which substantially corresponds to the lithographic film.

Since the proportion of sensitizer compared with the proportion of photoconductor in an insulating layer is generally relatively small and is preferably about 0.01% by weight, calculated on the photoconductor weight, it was not to be expected that a sensitizer would cause a increase in the sensitivity of the photoconductor. This expectation is confirmed by the fact that the use of known sensitizers such as Thioflavin, Acridine Orange, Trypaflavin or Acridine Yellow does not give a corresponding increase. Nor was it intended to cause such an increase within the characteristic sensitivity range. Instead, all efforts were aimed at extending the sensitivity into the yellow and red spectral ranges.

The photoconductive insulating layer contains from about 0.01 to 10 percent by weight of sensitizer, preferably about 5 percent, calculated on the total weight of the photoconductor component.

Sensitizers which are used according to the invention are polymethine dyestuffs which absorb in the spectral range of 400 to 550 nm, preferably 480 to 520 nm, and the two orange dyestuffs mentioned above are especially preferred. Other dyestuffs which advantageously may be used include by example, C.I. Basic Yellow 11 (C.I. 48055), known as Astrazone Yellow 3G, C.I. Basic Yellow 12 (C.I. 48065), known as Astrazone Yellow 5G, and Basic Yellow 52115 (C.I. 48060), and also the as yet unclassified related dyestuffs Astrazone Orange 3R (C.I. Basic Orange 27), Astrazone Yellow 7GLL (C.I. Basic Yellow 21), Astrazone Yellow GRL (C.I. Basic Yellow 29) and Astra Yellow R (C.I. Basic Yellow 44).

An insulating photoconductive layer containing one of these sensitizers requires an energy of about 10 $\mu$W sec/cm$^2$ for discharge to half the value of the initial potential, which means for an organic photoconductive layer great sensitivity to light of 490 nm.

It has been found that in the production of printing forms this great sensitivity to light of the copying materials achieves ever greater importance, since because of it the access time to the actual information can be shortened.

The electrophotographic material of the invention is especially intended for use in the electrophotographic production of printing forms and printed circuits, and the conductive support may be any material suitable for this purpose, for example, aluminum, zinc, magnesium or copper plates or multi-metal plates, and also cellulose products, for example, special papers, cellulose hydrate, cellulose acetate or cellulose butyrate films, especially partially saponified cellulose acetate or butyrate films. Some plastic materials, for example, polyamides in film form or metal-vaporized films, are suitable for use as supports.

Surface-aged aluminum foils have proved particularly suitable. The surface-aging process comprises mechanical or electrochemical roughening and, if required, subsequent anodizing and treatment with polyvinyl phosphonic acid, as described, for example, in German Offenlegungs schrift No. 1,621,478.

Preferred photoconductors for use in the sensitized insulating layer are those mentioned in German Pat. No. 1,120,875, especially substituted vinyl oxazoles such as 2-vinyl-4-(2'-chlorophenyl)-5-(4"-diethyl-aminophenyl)-oxazole. Other suitable photoconductors include, for example, triphenylamine derivatives, higher condensed aromatic compounds, such as anthracene, benzo-condensed heterocyclic compounds, and pyrazoline or imidazole derivatives.

Also suitable are triazole and oxadiazole derivatives, as disclosed in German Pat. Nos. 1,060,260, and 1,058,836; 2,5-bis-(4'-diethylaminophenyl)-1,3,4-oxadiazole is particularly suitable. In addition, vinyl aromatic polymers such as polyvinyl anthracene, polyacenaphthylene, poly-N-vinylcarbazole and copolymers of these compounds are suitable, provided they are suitable for a solubility differentiation with respect to the toner covered image areas and to the nonimage areas, in conjunction with a resin binding agent if required. Also suitable are polycondensates of aromatic amines and aldehydes, as described in German Auslegeschrift No. 1,197,325, and resins as described in German Offenlegungsschrift No. 2,137,288.

The photoconductive layer preferably also contains one or more resin binders. With regard to the film properties and adhesion, natural and/or synthetic resins are suitable for use as resin binders. In addition to the film-forming and electrical properties, and also adhesion to the support, solubility properties in particular play a special part in their selection. For practical purposes, the resin binding agents which are particularly suitable are those which are soluble in aqueous or alcoholic solvent systems, with the addition of acid or alkali if required. Aromatic or aliphatic, easily combustible solvents are excluded for physiological and safety reasons. The most suitable resin binding agents are high molecular substances carrying alkali-solubilizing groups. Such groups are, for example, acid anhydride, carboxyl, phenol, sulfonic acid, sulfonamide or sulfonimide groups. Resin binding agents with high acid numbers are preferably used, since these are particularly easily soluble in alkaline-aqueous-alcoholic solvent systems. Copolymers with anhydride groups can be used with great success, since due to the absence of free acid groups the dark conductivity of the electrophotographic layer is low, in spite of good solubility in alkali.

Copolymers of styrene and maleic anhydride, for example, those known under the name Lytron ®, Monsanto Company, USA, are especially suitable; also phenol resins, for example those known under the name Alnovol ®, Hoechst AG, Werk Albert, Germany, have proved very satisfactory.

The following examples further illustrate the invention:

COMPARISON EXAMPLE

A solution is prepared containing 40 g of 2-vinyl-4-(2'-chlorophenyl)-5-(4"-diethylaminophenyl)-oxazole and 60 g of a styrene/maleic anhydride copolymer in 300 g of glycol monomethyl ether, 470 g of tetrahydrofuran, and 130 g of butyl acetate. The resulting stock solution is divided into portions of 150 g each. One of the portions remains unsensitized. To each of the other five solutions 0.6 ml of a 0.1 percent methanol solution of a dyestuff is added, using the known dyestuff sensitizers Thioflavin, Trypaflavin, Acridine Yellow and Acridine Orange and the sensitizer used according to the present invention, viz. Astrazone Orange R. The quantity of sensitizer added, calculated on the photoconductor weight, is 0.01 percent. The solutions are cast in known manner into photoconductor layers and the sensitivity of these layers at 490 nm is determined. In the case of the known dyestuff sensitizers Thioflavin, Trypaflavin, Acridine Yellow and Acridine Orange, no sensitizing effect and ensuing increased sensitivity over that of the pure photoconductor layer can be detected. In the case of Astrazone Orange R, however, the sensitivity of the photoconductor is unmistakably increased by a factor greater than 2.

EXAMPLE 1

A solution of 40 grams of 2-vinyl-4-(2'-chlorophenyl)-5-(4"-diethylaminophenyl)-oxazole, 47 grams of a copolymer of styrene and maleic acid anhydride, 10 grams of a chlorocaoutchouc and 2 grams of Astrazone Orange R (C.I. Basic Orange 22) in 510 grams of tetrahydrofuran, 330 grams of methylglycol and 150 grams of butyl acetate was applied to a 100 $\mu$ thick aluminum foil, which had been mechanically roughened by wire brushing, with a brush depth of approximately 3 μ. After the evaporation of the solvent there remained a photoconductor layer with a thickness of 4–5 μ, which absorbed light in the blue spectral range with a maximum at 490 nm and became photoconductive. The energy required to discharge the layer to half the charge potential was 10 μW sec/cm$^2$. The layer was charged in the manner usual for electrophotography with a corona device to a surface potential of −400 V and imagewise exposed with a modulated 10 mW argon ion laser having a wavelength of 488 nm. A printing form was produced by the process described in German Auslegeschrift No. 1,117,391.

EXAMPLE 2

A solution of 27 grams of 2-vinyl-4-(2'-chlorophenyl)-5-(4''-diethylaminophenyl)-oxazole, 38 grams of a copolymer of styrene and maleic acid anhydride, 12 grams of a chlorocaoutchouc and 1.35 grams of Astrazone Orange R (C.I. Basic Orange 22) in 410 grams of tetrahydrofuran, 260 grams of methylglycol and 120 grams of butyl acetate was applied to a 300 μ thick aluminum foil which had been electrochemically roughened, anodized and treated with polyvinylphosphonic acid. After drying with warm air, the thickness of the layer was about 5 μ. The sensitivity corresponds to that of the layer described in Example 1. After charging and imagewise exposure with a modulated 10 mW argon ion laser, a printing form was produced by the process described in German Offenlegungsschrift No. 2,322,046.

EXAMPLE 3

A solution of 45 grams of 2-vinyl-4-(2'-chlorophenyl)-5-(4''-diethylaminophenyl)-oxazole, 45 grams of a copolymer of styrene and maleic acid anhydride and 2.25 grams of Astrazone Orange R (C.I. Basic Orange 22) in 280 grams of tetrahydrofuran, 180 grams of methylglycol and 84 grams of butyl acetate was prepared and used to coat a polyester film about 100 μ thick having aluminum vaporized onto it. After evaporation of the solvent, there remained a photoconductor layer about 5 μ thick with a maximum sensitivity in the blue spectral range. The film was charged with a corona device to about −450 V and exposed in a repro-camera with 8 auto photo lamps of 500 watts each for 25 seconds. The mounting of a printed circuit on a board printed with blue orientation lines served as the original. Due to the high sensitivity to light of the photoconductor layer in the blue spectral range, these blue orientation lines were not reproduced on the copied film. After the development and removal of the photoconductor layer in the exposed areas according to the process described in German Offenlegungsschrift No. 2,322,047, the thin vaporized aluminum layer was removed by treatment with 2N sodium hydroxide solution, and a printed circuit was obtained.

EXAMPLE 4

The solution of photoconductor, binding agent and sensitizer described in Example 1, instead of being applied to a mechanically roughened aluminum foil, was applied to a zinc plate as conventionally used in relief printing. After evaporation of the solvent, the about 4 μ thick photoconductor layer which was sensitive in the blue range was negatively charged with a corona device to about 450 V. The photoconductor layer was exposed with an image-modulated beam from a 10 mW argon ion laser, and an energy of about 10$^{-5}$ W sec/cm$^2$ was required to discharge the layer. The conversion into a printing form was carried out in the manner described in German Auslegeschrift No. 1,117,391, by development with a toner powder, fixing the toner powder by means of heat, and removing the photoconductor layer by the action of an alkaline-alcoholic solution. Etching to produce a relief printing form is carried out with diluted nitric acid in the manner usual for the production of electrotypes.

EXAMPLE 5

The coating solution described under Example 3 was used to coat a multi-metal plate made of aluminum/copper/chromium. After the dried layer had been charged, it was exposed with a modulated argon ion laser in the manner described in Example 4. Development, fixing and decoating were carried out in a conventional manner. Conversion into a printing form was carried out by etching away the chromium layer in the areas affected by the laser light by means of a commercial chromium etching substance, thereby exposing copper, and subsequently dissolving away the developed photoconductor image by means of methylene chloride. The exposed chromium surface was water-accepting. The number of prints which could be obtained with the planographic printing form produced was very large.

EXAMPLE 6

A solution of 40 grams of 2,5-bis-(4'-diethylaminophenyl)-1,3,4-oxadiazole, 47 grams of a copolymer of styrene and maleic acid anhydride, 10 grams of a chlorocaoutchouc and 2.0 grams of Astrazone Orange R (C.I. Basic Orange 22) in 520 grams of tetrahydrofuran, 330 grams of methylglycol and 150 grams of butyl acetate was applied to a 100 μ thick aluminum foil which had its surface roughened by mechanical means. After evaporation, the thickness of the electrophotographic insulating layer was approximately 5 μ. The sensitivity of the layer was in the blue spectral range with a maximum at 480 nm. The energy required to discharge the layer to half the value of the initial potential was 8 μW sec/cm$^2$ at 487 nm. After being charged to −450 V, the plate was exposed by means of a 10 mW argon ion laser, the beam of which was modulated to correspond to the image. Conversion into a printing form was achieved by developing and decoating according to German Offenlegungsschrift No. 2,322,046. The plate produced high quality prints with a resolution of 6 lines/nm (60 screen) and an edition of up to 100,000.

EXAMPLE 7

10 grams of 2,5-bis-(4'-diethylaminophenyl)-1,3,4-oxadiazole, 10 grams of a copolymer of styrene and maleic acid anhydride and 0.5 g of Astrazole Yellow 7 GLL were dissolved in 124 grams of glycol monomethylether, 30 grams of butyl acetate and 26 grams of butanone, and the solution was applied to a 100 μ thick aluminum foil mechanically roughened on the surface, in such a way that after evaporation of the solvent the thickness of the layer was about 5 μ. The layer had a maximum spectral sensitivity at 440 nm. The energy required to discharge the charged layer to half the value of the initial potential was 5 μW sec/cm$^2$. The layer was charged, exposed and developed in the usual manner to produce a printing form. The mounting of a page of a newspaper served as the original, using a support with blue orientation lines. After removal of the untoned, exposed areas of the photoconductor layer according to German Offenlegungsschrift No. 2,322,047, a planographic printing form for newspaper printing was obtained.

It will be obvious to those skilled in the art that many modifications may be made within the scope of the present invention without departing from the spirit thereof, and the invention includes all such modifications.

What is claimed is:

1. A material for electrophotographic reproduction, which comprises a conductive support having a sensitized photoconductive insulating layer thereon containing at least one organic photoconductor and containing, as a sensitizer, a polymethine dyestuff capable of effecting sensitization in the short wavelength absorption range of the photoconductor within the spectral range of 400 to 550 nm, the sensitizer having the general formula

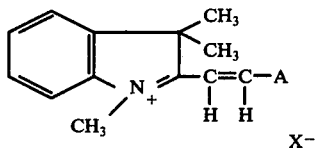

wherein A is an unsubstituted or substituted indolyl group, an unsubstituted or substituted benzthiazolylamino group, an unsubstituted or substituted phenylamino group, or an unsubstituted or substituted indolinyl group, and X⁻ is a monovalent anion.

2. A material as claimed in claim 1 wherein the sensitizer dyestuff is capable of absorbing radiation of a wavelength within the spectral range of 480 to 520 nm.

3. A material as claimed in claim 1 wherein X⁻ is a halide ion.

4. A material as claimed in claim 1 wherein X⁻ is a chloride ion.

5. A material as claimed in claim 1 wherein the sensitizer is C.I. Basic Orange 21 (C.I. 48035).

6. A material as claimed in claim 1 wherein the sensitizer is C.I. Basic Orange 22 (C.I. 48040).

7. A material as claimed in claim 1 wherein the sensitizer is C.I. Basic Yellow II (C.I. 48055), Basic Yellow 52115 (C.I. 48060), or C.I. Basic Yellow 12 (C.I. 48065).

8. A material as claimed in claim 1 wherein the sensitizer is Aztrazone Orange 3R (C.I. Basic Orange 27), Astrazone Yellow 7GLL (C.I. Basic Yellow 21), Astrazone Yellow GRL (C.I. Basic Yellow 2a) or Astra Yellow R (C.I. Basic Yellow 44).

9. A material as claimed in claim 1 wherein the photoconductive insulating layer contains 0.01 to 10 percent by weight of sensitizer, calculated on the total weight of the photoconductor.

10. A material as claimed in claim 9 wherein the photoconductive insulating layer contains about 5 percent by weight of sensitizer, calculated on the total weight of the photoconductor.

11. A material as claimed in claim 1 wherein the photoconductive insulating layer includes as a photoconductor an oxazole, triazole or oxadiazole derivative.

12. A material as claimed in claim 11 wherein the photoconductor is a substituted vinyl oxazole.

13. A material as claimed in claim 12 wherein the photoconductor is 2-vinyl-4-(2'-chlorophenyl)-5-(4''-diethylaminophenyl)-oxazole.

14. A material as claimed in claim 11 wherein the photoconductor is 2,5-bis-(4'-diethylaminophenyl)-1,3,4-oxadiazole.

15. A material as claimed in claim 1 wherein the conductive support comprises aluminum foil of which the surface adjacent the photoconductive insulating layer has been mechanically or electrochemically roughened.

16. A material as claimed in claim 15 wherein the surface of the aluminum foil has been electrochemically roughened, optionally anodized, and treated with polyvinyl phosphonic acid.

17. A material as claimed in claim 1 wherein the photoconductive insulating layer includes as a binder a natural or synthetic resin.

18. A material as claimed in claim 17 wherein the binder comprises a polymeric material containing alkali-solubilizing groups.

19. A material as claimed in claim 18 wherein the binder comprises a polymeric material containing acid anhydride groups.

20. A material as claimed in claim 19 wherein the binder comprises a copolymer of styrene and maleic anhydride.

21. A process for the production of a printing form or a printed circuit, which includes uniform charging imagewise exposing and developing a material as claimed in claim 1.

22. A printing form or a printed circuit produced by the process claimed in claim 21.

* * * * *